United States Patent [19]

Park et al.

[11] Patent Number: 5,311,076

[45] Date of Patent: May 10, 1994

[54] TRISTATE DATA OUTPUT BUFFER HAVING REDUCED SWITCHING NOISE AND INTERMEDIATE-LEVEL SETTING

[75] Inventors: Yong-Bo Park; Hee-Choul Park; Hyung-Kyu Lim, all of Suwon, Rep. of Korea

[73] Assignee: Samsung Electronics Co., Ltd., Kyungki, Rep. of Korea

[21] Appl. No.: 964,622

[22] Filed: Oct. 23, 1992

[30] Foreign Application Priority Data

Oct. 25, 1991 [KR] Rep. of Korea ............... 18835/1991

[51] Int. Cl.⁵ .......................................... H03K 19/003
[52] U.S. Cl. .................................. 307/443; 307/473; 307/475; 365/189.09; 365/203
[58] Field of Search .................. 365/189.01, 189.06, 365/189.09, 203, 206; 307/443, 451, 473, 475

[56] References Cited

U.S. PATENT DOCUMENTS

| | | | |
|---|---|---|---|
| 4,963,774 | 10/1990 | Masuda | 307/443 X |
| 4,983,860 | 1/1991 | Yim et al. | 307/443 |
| 4,988,888 | 1/1991 | Hirose et al. | 307/473 X |
| 4,991,140 | 2/1991 | Wang et al. | 365/203 |
| 5,051,619 | 9/1991 | Campione | 307/473 X |
| 5,057,711 | 10/1991 | Lee et al. | 365/189.05 |
| 5,239,211 | 8/1993 | Jinbo | 307/443 |

Primary Examiner—David R. Hudspeth
Attorney, Agent, or Firm—Robert A. Westerlund; Charles R. Donohoe

[57] ABSTRACT

A data output buffer suitable for use in a semiconductor memory device includes a first input circuit coupled to a first data signal and a first control signal, e.g., an output enable signal, and a second input circuit coupled to a second data signal which is the inverse of the first data signal and the first control signal. The data output buffer also includes a pull-up circuit responsive to the output of the first input circuit for selectively raising the data output node to a high voltage level, e.g., Vcc, and a pull-down circuit responsive to the output of the second input circuit for selectively lowering the data output node to a low voltage level, e.g., Vss. The data output buffer further includes a preset circuit comprised of a first preset control circuit responsive to the output of the first input circuit and a second control signal, e.g., an inverse output enable signal, for selectively raising the data output node from the low voltage level to an intermediate voltage level, e.g., ½ Vcc, and a second preset control circuit responsive to the output of the second input circuit and the second control signal for selectively lowering the data output node from the high voltage level to the intermediate voltage level. The preset control circuit advantageously operates to maintain the data output node at the intermediate voltage level during active states of the output enable signal without generating any DC current, thereby eliminating the noise and reliability problems of presently available data output buffers.

20 Claims, 3 Drawing Sheets

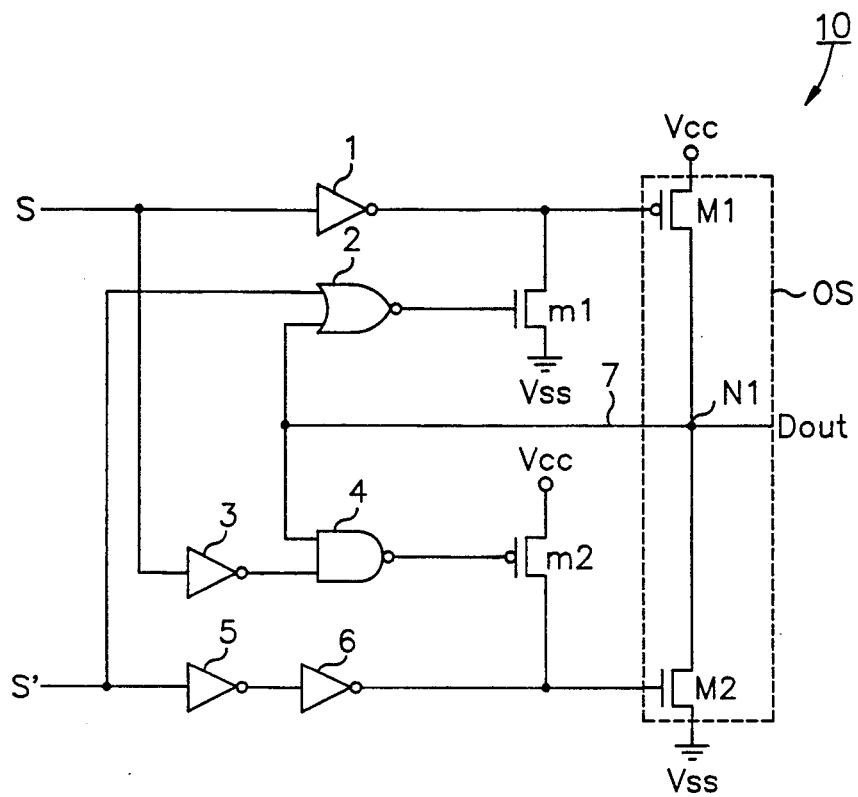
(PRIOR ART)
FIG. 1
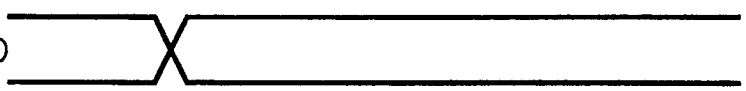
FIG. 2A ADD
FIG. 2B S,S'
FIG. 2C Dout

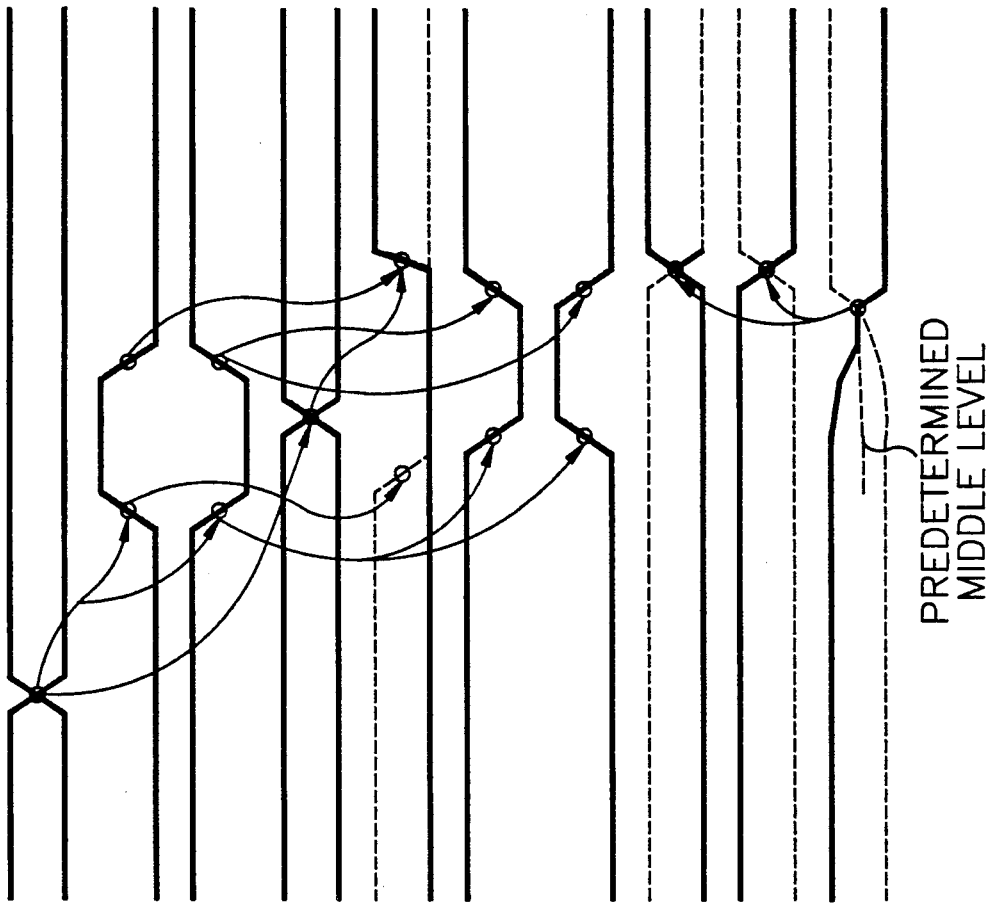

TRISTATE DATA OUTPUT BUFFER HAVING REDUCED SWITCHING NOISE AND INTERMEDIATE-LEVEL SETTING

BACKGROUND OF THE INVENTION

The present invention relates generally to semiconductor memory devices, and more particularly, to a novel data output buffer, suitable for use therein, characterized by reduced DC current levels and consequently, reduced noise levels.

In general, a data output buffer of a semiconductor memory device (e.g., a DRAM or SRAM) receives and amplifies data signals read out from a memory cell, and subsequently outputs the amplified data signals for utilization thereof externally of the semiconductor memory device. Such a data output buffer generally includes an output or final stage comprised of large-sized MOS transistors.

As semiconductor technology continues to evolve towards higher density and higher operational speed semiconductor memory devices, the noise generated by the data output buffers thereof has increased. This increase in the noise level of the data output buffers is largely attributable to the increase in the impulsive peak currents generated by the large-sized MOS transistors of the output stage thereof during transitions of the data signals from a logic low level to a logic high level and vice versa. In addition to undesirably increasing the noise level of the data output buffers, these impulsive peak currents adversely influence the power supply lines of the memory device, thereby degrading the performance and reliability of the memory device.

One recent proposal for minimizing the above-described impulsive peak currents is to limit the voltage swing of the output stage of the data output buffer. Conventionally, the output node of the output stage of the data output buffer is designed to swing fully between a reference voltage (Vss), which is typically 0.0V, i.e., ground, and the full power supply voltage (Vcc), which is typically 5.0V, upon transitions in the logic level of the data signal processed thereby.

More particularly, a data output buffer constructed in accordance with this recent proposal is disclosed in Japanese Patent Publication No. 1-149290, for an invention entitled "OUTPUT CIRCUIT OF STATIC RAM", and is depicted in FIG. 1. With reference now to FIG. 1, the output node N1 of the output stage OS of the data output buffer 10 depicted therein is designed to swing only between an intermediate level and the high level (Vcc), and between an intermediate level and the low level (Vss), thereby reducing the impulsive peak currents generated by the output stage OS upon transitions in the logic level of the data signals S,S'. As can be readily seen, the output stage OS is comprised of two relatively large-sized MOS transistors M1 and M2 connected in series between Vcc and Vss. The transistor M1 is a PMOS transistor, and the transistor M2 is an NMOS transistor. The output signal Dout of the data output buffer 10 is taken from output node N1 located intermediate the transistors M1 and M2. As will be more fully developed below, the data output buffer 10 includes a pull-down transistor m1, a pull-up transistor m2, and logic circuitry (1,2,3,4,5,6), which cooperatively function to maintain the voltage level of the data output signal Dout appearing at the output node N1 at the intermediate level prior to execution of a data output operation.

More particularly, with additional reference to the signal timing diagrams depicted in FIGS. 2A–2C, on of the data output buffer 10 will now be described. In general, the data signals S,S' can have any one of three different logic states. In a first logic state, the data signal S is at the logic high level (i.e., high), and its complementary data signal S' is at the logic low level (i.e., low). In a second logic state, the data signal S is low, and the complementary data signal S' is high. In a third logic state, the data signals S,S' are both low.

In operation, when valid address signals (not shown) specifying a memory cell to be accessed are received, an address transition detection (ATD) circuit (not shown) of the memory device generates an ATD signal (not shown), which initiates a read operation, wherein data is read out of the specified memory cell. The read-out data appears as data signals S,S', which are input signals to the data output buffer 10. The data signals S,S' are in their third logic state (i.e., both low) after the ATD signal goes high and before the read-out data is received by the data output buffer 10, (i.e., before a data output operation is executed).

When the data signals S,S' are in their third logic state, the transistors M1 and M2 of the output stage OS are both turned off, because the data signal S is inverted by the inverter 1 before application thereof to the gate of the PMOS transistor M1, and the complementary data signal S' is twice-inverted by the series-connected inverters 5, 6 before application thereof to the gate of the NMOS transistor M2. Therefore, the signal presented to the gate of the PMOS transistor M1 is high, thereby turning this transistor off, and the signal presented to the gate of the NMOS transistor M2 is low, thereby turning this transistor off. A NAND gate 4 receives at one of its inputs the output signal Dout at one of its inputs the output signal Dout at one of its inputs, and an inverted version of the data signal S, via an inverter 3, at its outer input.

If the previous logic state of the output signal Dout was high, then the output of the NAND gate 4 goes low when the data signals S,S' are in their third logic state, because both inputs thereto will be high at this time. When this occurs, the low output of the NAND gate 4, which is applied to the gate of the pullup PMOS transistor m2, turns the transistor m2 on, thereby raising the level of the S'line connected to the gate of the NMOS transistor M2, and thus, partially turning on the transistor M2. In this connection, the channel sizes of the transistors m1 and m2 are selected such that when they are fully turned on, the transistors M1 and M2 are only slightly turned on. For example, when the transistor m2 is fully turned on, the voltage level of the S' line can be raised to ½ Vcc, rather than full Vcc, to thereby only partially turn on the transistor M2. When the transistor M2 of the output stage OS is partially turned on, the output signal Dout appearing at the output node N1 is decreased to its intermediate level. It should be noted that the output of the NOR gate 2 is low when the previous logic state of the output signal Dout was high, and thus, the NMOS transistor m1 is turned off, thereby ensuring that the transistor M1 of the output stage OS stays turned off.

If the previous logic state of the output signal Dout was low, then the output of the NAND gate 4 goes high when the data signals S,S' are in their third logic state, since the Dout input to the NAND gate will be low at this time. When this occurs, the high output of the NAND gate 4, which is applied to the gate of the pull-up PMOS transistor m2, turns the transistor m2 off, thereby preventing the level of the S' line from being raised to a higher level, which keeps the NMOS transistor M2 of the output stage OS turned off. Further, when the previous logic state of the output signal Dout was low, the output of the NOR gate 2 goes high, since both inputs thereto will be low at this time. Consequently, the high output of the NOR gate 2 turns the pull-down NMOS transistor ml on, thereby lowering the voltage level of the signal line S, which partially turns on the PMOS transistor M1 of the output stage OS. When the transistor M1 is thus partially turned on, the output signal Dout appearing at the output node N1 is increased to its intermediate level.

Upon completion of a read operation, the data signals S,S' are driven to either their first or second logic state, depending upon whether a '1' or '0' was stored in the accessed memory cell. If the data signal S,S' are driven to their first logic state, the data signal S will be high and the complementary data signal S' will be low. In this case, the signal applied to the gate of the PMOS transistor M1 of the output stage OS, which is the inverse of the data signal S, will be low, thereby fully turning on the transistor M1, and thereby driving the output signal Dout from its intermediate level to its low level, i.e., the output node N1 will be pulled-up to its high level, Vcc. Further, if the data signals S,S' are driven to their second logic state, the data signal S will be low and the complementary data signal S' will be high. In this case, the signal applied to the gate of the NMOS transistor M2 of the output stage OS, which is the non-inverted complementary data signal S', will be high, thereby fully turning on the transistor M2, and thereby driving the output signal Dout from its intermediate level to its low level, i.e., the output node N1 will be pulled-down to its low level, Vss.

Thus, it can be appreciated that the output of the data output buffer 10 depicted in FIG. 1 is only drive between an intermediate level and a high level, or between an intermediate level and a low level, when a read operation is performed, and is maintained at o the intermediate level between successive read operations. Consequently, the impulsive peak currents generated by such a data output buffer are significantly reduced relative to conventional data output buffers, and thus, the noise generated during transition of the data signals is commensurately reduced. Further, the operational speed of such a data output buffer is significantly increased relative to conventional data output buffers. However, the data output buffer 10 still suffers from the following drawback. More particularly, in order to maintain the data output signal Dout at its intermediate level between successive read operations, it is necessary that the transistors M1 and M2 of the output stage OS thereof be slightly turned on, and further, that one of the transistors ml of m2 be fully turned on, depending upon the previous logic state of the data output signal Dout. As such, DC current flows through both the transistors M1 and M2, as well as one of the transistors ml or m2, during the period the data output signal Dout is maintained at its intermediate level, thereby generating undesirable noise. For example, when the data signals S,S' are in their third logic state (i.e., both low), and the previous data output signal Dout was high, the transistor m2 is turned on. When the transistor m2 is turned on, DC current will flow between the power supply voltage Vcc and the ground voltage Vss, via transistor mn2 of the inverter 6. Similarly, when the data signals S,S' are in their third logic state (i.e., both low), and the previous data output signal Dout was low, the transistor ml is turned on. When the transistor m2 is turned on, DC current will flow from the power supply voltage Vcc to the ground voltage Vss, via a PMOS transistor (not shown) of the inverter 1 and the source-drain channel of the transistor m1.

Thus, as is evident from the foregoing, there presently exists a need for a data output buffer for use in semiconductor memory devices which overcomes the above-described drawback of presently available data output buffers. The present invention fulfills this need.

SUMMARY OF THE INVENTION

The present invention encompasses a data output buffer suitable for use in a semiconductor memory device. The data output buffer includes a first input circuit coupled to a first data signal and a first control signal, e.g., an output enable signal, and a second input circuit coupled to a second data signal which is the inverse of the first data signal and the first control signal. The data output buffer also includes a pull-up circuit responsive to the output of the first input circuit for selectively raising the data output node to a high voltage level, e.g., Vcc, and a pull-down circuit responsive to the output of the second input circuit for selectively lowering the data output node to a low voltage level, e.g., Vss. The data output buffer further includes a preset circuit comprised of a first preset control circuit responsive to the output of the first input circuit and a second control signal, e.g., an inverse output enable signal, for selectively raising the data output node from the low voltage level to an intermediate voltage level, e.g., ½ Vcc, and a second preset control circuit responsive to the output of the second input circuit and the second control signal for selectively lowering the data output node from the high voltage level to the intermediate voltage level. The preset control circuit advantageously operates to maintain the data output node at the intermediate voltage level during active states of the output enable signal without generating any DC current, thereby eliminating the noise and reliability problems of presently available data output buffers.

DETAILED DESCRIPTION OF THE DRAWINGS

These and various other features and advantages of the present invention will be readily understood with reference to the following detailed description taken in conjunction with the accompanying drawings, wherein like reference numerals designate like structural elements, and, in which:

FIG. 1 is a schematic block diagram of a presently available data output buffer;

FIG. 2A-2C are signal timing diagrams illustrating the operation of the data output buffer depicted in FIG. 1;

DETAILED DESCRIPTION OF THE INVENTION

Figure 3:
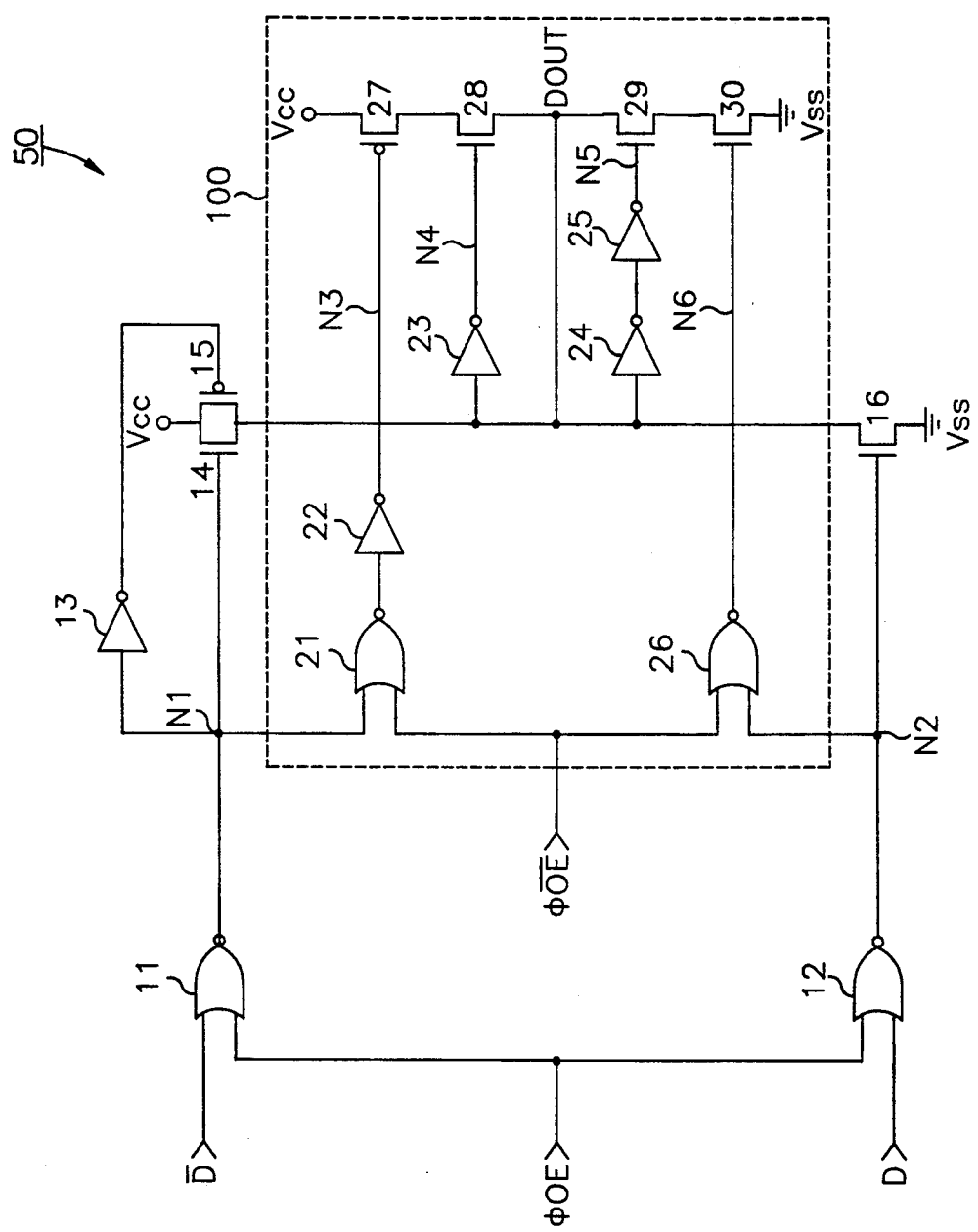
FIG. 3 is a schematic block diagram of a data output buffer constructed in accordance with a preferred embodiment of the present invention; and, FIGS. 4A-4J are signal timing diagrams illustrating the operation of the data output buffer depicted in FIG. 3.

With reference now to FIG. 3, there can be seen a schematic block diagram of a data output buffer 50 constructed in accordance with a preferred embodiment of the present invention. The data output buffer 50 includes a preset circuit 100 for maintaining data output signal DOUT at an intermediate level when an output enable signal $\phi$OE is high (i.e., active), e.g., between successive read operations of a semiconductor memory device (not shown) in which the data output buffer 50 is employed. Thus, the preset circuit 100 functions to preset the output node of the data output buffer 50 to an intermediate level in preparation for (i.e., in advance of) a data output operation, i.e., prior to the time that the data read from an accessed memory cell (not shown) is presented to the inputs of the data output buffer 50. Therefore, the preset circuit 100 minimizes the voltage swing at the output node of the data output buffer 50 during transitions in the logic state of the data signals processed thereby, in a manner which will be fully developed hereinafter.

The preset circuit 100 includes a first control circuit comprised of a first two-input NOR gate 21 and a first inverter 22. The first NOR gate 21 receives the output of a first input circuit 11 at one of its inputs, and the complement $\phi$/OE of the output enable signal $\phi$OE at its other input. The preset circuit 100 also includes a second control circuit comprised of a second inverter 23 which receives the data output signal DOUT at its input, and a third control circuit comprised of series-connected third and fourth inverters 24,25, with the input of the third inverter 24 being coupled to the data output signal DOUT. The preset circuit 100 further includes a fourth control circuit comprised of a second two-input NOR gate 26 which receives the output of a second input circuit 12 at one of its inputs, and the inverse output enable signal $\phi$/OE at its other input. The present circuit 100 further includes a pull-up stage comprised of PMOS transistor 27 and NMOS transistor 28 connected in series between the power supply voltage Vcc and the data output node DOUT, and a pull-down stage comprised of NMOS transistors 29 and 30 connected in series between the data output node DOUT and the ground voltage Vss. The pull-up stage is responsive to the outputs N3 and N4 of the first and second control circuits, respectively, to pull-up the data output node DOUT to the intermediate level, which is preferably ½ Vcc, although this is not limiting to the present invention. The pull-down stage is responsive to the outputs N5 and N6 of the third and fourth control circuits, respectively, to pull-down the data output node DOUT to the intermediate level.

The data output buffer 50 also includes a pull-up circuit comprised of an NMOS transistor 14 and a PMOS transistor 15 having a first electrode commonly coupled to Vcc, and a second electrode commonly coupled to the data output node DOUT, to the input of the second inverter 23, the input of the third inverter 24, and a first electrode of an NMOS transistor 16, whose other/second electrode is connected to Vss. The pull-up circuit also includes a fifth inverter 13 whose output is coupled to the gate of the transistor 15 and whose input is coupled to receive the output of the first input circuit 11, which appears at first internal node N1. The output of the first input circuit 11 is also applied to the gate of the transistor 14. The pull-up circuit functions in a manner described hereinafter to pull-up the data output node DOUT to the level of the supply voltage Vcc (i.e., the high level), in response to the output of the first input circuit 11. The transistor 16 comprises a pull-down circuit which functions to pull-down the data output node DOUT to the ground voltage Vss (i.e., the low level), in response to the output of the second input circuit, which appears at second internal node N2.

With additional reference now to the signal timing diagrams depicted in FIGS. 4A–4J, the operation of the data output buffer 50 depicted in FIG. 3 will now be described. More particularly, when valid address signals ADD specifying a memory cell to be accessed are received by the semiconductor memory device in which the data output buffer 50 is utilized, an address transition detection (ATD) circuit (not shown) of the memory device generates an ATD signal (not shown), which initiates a read operation and drives the output enable signal $\phi$OE high and the inverse output enable signal $\phi$OE low. However, there is a delay between the time that the read cycle is initiated and the time that data signals D,/D representative of the data read from the accessed memory cell are received at the inputs to the data output buffer 50. During this delay period, the $\phi$OE signal is high and the $\phi$OE signal is low, and the data signals D,/D are both low. When the output enable signal $\phi$OE is high, the output signals of the first input circuit 11 nd the second input circuit 12 appearing at the first and second internal nodes N1, N2, respectively, are both low, thereby inactivating the pull-up circuit comprised of the transistors 14, 15 and the pull-down circuit comprised of the transistor 16.

The first NOR gate 21 of the first control circuit (21, 22) and the second NOR gate 26 of the second control circuit (26) each receive, at one of their inputs, the inverse output enable signal $\phi$/OE, which is low at this time. Therefore, since the data signal /D received at the other input of the first NOR gate 21 is also low, the output of the first NOR gate 21 goes high and the output N3 of the inverter 22 (i.e., the output of the first control circuit) therefore goes low, thereby turning on the PMOS transistor 27 of the pull-up stage (27, 28). Further, since the data signal D received at the other input of the second NOR gate 26 is also low, the output N6 of the second NOR gate 26 (i.e., the output of the second control circuit) goes high, thereby turning on the NMOS transistor 30 of the pull-down stage (29, 30).

In this case, if the data output node DOUT was previously high as a result of a previous read operation, i.e., before the output enable signal $\phi$OE was driven high, the pull-down transistor 29 of the pull-down stage (29, 30) is turned on by the output signal N5 (which is a non-inverted version of the DOUT signal) of the third control circuit (24, 25), thereby lowering the voltage level of the data output node DOUT to the intermediate level (e.g., ½ Fcc). Also, if the data output node DOUT was previously high, the pull-up transistor 28 of the pull-up state (27, 28) is turned off by the output signal N4 (which is the inverse of the DOUT signal) of the second control circuit 23, thereby preventing the data output node DOUT from being pulled-up to a higher voltage level.

On the other hand, if the data output node DOUT was previously low, the output signal N4 of the second control circuit 23 goes high, thereby turning on the NMOS transistor 28 of the pull-up stage (27, 28), raising the voltage level of the data output node DOUT to the intermediate level (e.g., ½ Vcc). Also, if the data output node DOUT was previously low, the pull-down transistor 29 of the pull-down signal stage (29, 30) is turned off by the output signal N5 of the third control circuit (24, 25), thereby preventing the data output node DOUT from being pulled-down to a lower voltage level.

It should be clearly understood that the data output node DOUT is maintained at the intermediate level by the preset circuit 100 only during the time period when the output enable signal $\phi$OE is high and the inverse output enable signal $\phi$/OE is low. Thereafter, when the inverse output enable signal $\phi$/OE goes high, the signals N3 and N6 go high and low, respectively, thereby turning off the pull-up transistor 27 of the pull-up stage (27, 28) and turning off the pull-down transistor (30) of the pulldown stage (29, 30).

After the delay period has elapsed, and the output enable signal $\phi$OE goes low and the inverse output enable signal $\phi$/OE goes high, the voltage level of the data output node DOUT is driven from the intermediate level (e.g., ½ Vcc) to either the high level (e.g., Vcc) or the low level (e.g., Vss), depending upon the logic state of the data signals D, D read from the accessed memory cell. In this connection, if the data signals D and /D are high and low, respectively, the transistors 14 and 15 of the pull-up circuit (13, 14, 15) are turned on and the transistor 16 of the pull-down circuit (16) is turned off, thereby raising the voltage level of the data output node DOUT to the high level (e.g., Vcc), since the data output node DOUT is connected to the second electrode of the transistors 14, 15 of the pull-up circuit (13, 14, 15). Conversely, if the data signals D and /D are low and high, respectively, the pull-up transistors 14 and 15 are turned off and the pull-down transistor 16 is turned off, thereby lowering the voltage level of the data output node DOUT to the low level (e.g., Vss), since the data output node DOUT is connected to the first electrode of the pull-down transistor 16.

It should be readily appreciated from the foregoing that the data output node DOUT is maintained at the intermediate level only when the output enable signal $\phi$OE is high and the inverse output enable signal $\phi$/OE is low, and further, that no DC current is generated during this time period. Therefore, the data output buffer of the present invention overcomes the noise and reliability problems of presently available data output buffers.

Although a preferred embodiment of the present invention has been described in detail hereinabove, it should be clearly understood that many variations and/or modifications of the basic inventive concepts herein taught which may appear to those skilled in the pertinent art will still fall within the spirit and scope of the present invention, as defined in the appended claims.

What is claimed is:

1. A data output buffer, comprising:
   a data output node;
   a first input circuit having a first input coupled to a first input signal, and a second input coupled to a first control signal;
   a second input circuit having a first input coupled to a second input signal, and a second input coupled to said first control signal;
   a pull-up circuit responsive to the output of said first input circuit for selectively raising said output node to a high voltage level;
   a pull-down circuit responsive to the output of said second input circuit for selectively lowering said data output node to a low voltage level;
   a first preset control circuit responsive to said output of said first input circuit and a second control signal for selectively raising said data output node from said low voltage level to an intermediate voltage level; and,
   a second preset control circuit responsive to said output of said second input circuit and said second control signal for selectively lowering said data output node from said high voltage level to said intermediate voltage level.

2. The buffer as set forth in claim 1, wherein said second input signal is the inverse of said first input signal.

3. The buffer as set forth in claim 2, wherein said first input signal comprises a data signal from a selected memory cell of a semiconductor memory device, and said second input signal comprises an inverse data signal from said selected memory cell.

4. The buffer as set forth in claim 3, wherein said first control signal comprises an output enable signal, and said second control signal comprises an inverse output enable signal.

5. The buffer as set forth in claim 2, wherein said pull-up circuit is connected to said data output node and is adapted to selectively raise said data output node to said high voltage level in response to said output of said first input circuit going from a first logic state to a second logic state.

6. The buffer as set forth in claim 5, wherein said pull-down circuit is connected to said data output node and is adapted to selectively lower said data output node to said low voltage level in response to said output of said second input circuit going from a first logic state to a second logic state.

7. The buffer as set forth in claim 6, wherein said first preset control circuit comprises:
   a pull-up stage comprised of a first MOS transistor having a first electrode connected to a source of high voltage, a second electrode, and a gate, and a second MOS transistor having a first electrode connected to said second electrode of said first MOS transistor, a second electrode connected to said data output node, and a gate;
   a first control circuit having a first input coupled to said output of said first input circuit, a second input coupled to said second control signal, and an output coupled to said gate of said first MOS transistor of said pull-up stage; and,
   a second control circuit having an input coupled to said data output node and an output connected to said gate of said second MOS transistor of said pull-up stage.

8. The buffer as set forth in claim 7, wherein said second preset control circuit comprises:
   a pull-down stage comprised of a first MOS transistor having a first electrode connected to said data output node, a second electrode, and a gate, and a second MOS transistor having a first electrode connected to said second electrode of said first MOS transistor, a second electrode connected to a source of low voltage, and a gate;
   a third control circuit having an input coupled to said data output node and an output coupled to said gate of said first MOS transistor of said pull-down stage; and,
   a fourth control circuit having a first input coupled to said second control signal, a second input coupled to said output of said second input circuit, and an output coupled to said gate of said second MOS transistor of said pull-down state.

9. The buffer as set forth in claim 8, wherein said source of high voltage comprises the full power supply voltage of a semiconductor memory chip, and said source of low voltage comprises a ground potential.

10. A data output buffer suitable for use in a semiconductor memory device having circuitry for generating an output enable signal and an inverse output enable signal, comprising:

a data output node;

a first input circuit having a first input coupled to a first data signal, and a second input coupled to a second input circuit having a first input coupled to a second data signal, wherein said second data signal is the inverse of said first data signal, and a second input coupled to said output enable signal;

a pull-up circuit connected to said data output node and adapted to pull up said data output node to a high voltage level in response to the output of said first input circuit going from a first logic state to a second logic state;

a pull-down circuit connected to said data output node and adapted to pull down said data output node to a low voltage level in response to the output of said second input circuit going from a first logic state to a second logic state;

a preset circuit comprising:

a pull-up stage comprised of a first MOS transistor having a first electrode connected to a high voltage source, a second electrode, and a gate, and a second MOS transistor having a first electrode connected to said second electrode of said first MOS transistor, a second electrode connected to said data output node, and a gate;

a first control circuit having a first input coupled to said output of said first input circuit, a second input coupled to said inverse output enable signal, and an output coupled to said gate of said first MOS transistor of said pull-up stage;

a second control circuit having an input coupled to said data output node and an output connected to said gate of said second MOS transistor of said pull-up stage;

a pull-down stage comprised of a first MOS transistor having a first electrode connected to said data output node, a second electrode, and a gate, and a second MOS transistor having a first electrode connected to said second electrode of said first MOS transistor, a second electrode connected to a low voltage source, and a gate;

a third control circuit having an input coupled to said data output node and an output coupled to said gate of said first MOS transistor of said pull-down stage;

a fourth control circuit having a first input coupled to said inverse output enable signal, a second input coupled to said output of said second input circuit, and an output coupled to said gate of said second MOS transistor of said pull-down stage;

wherein said first control circuit of said preset circuit is responsive to said inverse output enable signal and said output of said first input circuit to selectively turn on said first MOS transistor of said pull-up stage;

wherein said second control circuit of said preset circuit is responsive to a low voltage level of said data output node to selectively turn on said second MOS transistor of said pullup stage, to thereby raise the voltage level of said data output node from said low voltage level to an intermediate voltage level, during times when said first MOS transistor of said pull-up stage is turned on;

wherein said third control circuit of said preset circuit is responsive to a high voltage level of said data output node to selectively turn on said first MOS transistor of said pulldown stage, to thereby lower the voltage level of said data output node from a high voltage level to said intermediate voltage level, during times when said second MOS transistor of said pull-down stage is turned on;

wherein said fourth control circuit of said preset circuit is responsive to said output signal of said second input circuit and said inverse output enable signal for selectively turning on said second MOS transistor of said pull-down stage; and, wherein said intermediate voltage level is higher than said low voltage level but less than said high voltage level.

11. The buffer as set forth in claim 10, wherein said first MOS transistor of said pull-up stage comprises a PMOS transistor, and said second MOS transistor of said pull-up stage comprises an NMOS transistor.

12. The buffer as set forth in claim 11, wherein said first and said second MOS transistors of said pull-down stage each comprise an NMOS transistor.

13. The buffer as set forth in claim 12, wherein said pull-up circuit comprises:

a first MOS transistor having a first electrode connected to said high voltage source, a second electrode connected to said data output node, and a gate;

a second MOS transistor having a first electrode connected to said high voltage source, a second electrode connected to said data output node, and a gate coupled to said output of said first input circuit; and, an inverter having an input connected to said output of said first input circuit, and an output connected to said gate of said first MOS transistor of said pull-up circuit.

14. The buffer as set forth in claim 13, wherein said first MOS transistor of said pull-up circuit comprises a PMOS transistor, and said second MOS transistor of said pull-up circuit comprises an NMOS transistor.

15. The buffer as set forth in claim 14, wherein said pull-down circuit comprises an NMOS transistor having a first electrode connected to said data output node, a second electrode connected to said low voltage source, and a gate connected to said output of said second control circuit.

16. The buffer as set forth in claim 15, wherein said first input circuit comprises a NOR gate having a first input coupled to said first data signal, and a second input coupled to said output enable signal.

17. The buffer as set forth in claim 16, wherein said second input circuit comprises a NOR gate having a first input coupled to said second data signal, and a second input coupled to said output enable signal.

18. The buffer as set forth in claim 17, wherein said first control circuit of said preset circuit comprises:

a NOR gate having a first input coupled to said output of said NOR gate of said first input circuit, and a second input coupled to said inverse output enable signal; and, at least one inverter having an input coupled to said output of said NOR gate of said first control circuit and an output coupled to said gate of said PMOS transistor of said pull-up stage, wherein said output of said at least one inverter is the inverse of said output of said NOR gate of said first control circuit.

19. The buffer as set forth in claim 18, wherein said second control circuit of said preset circuit comprises at least one inverter having an input coupled to said data output node and an output coupled to said gate of said NMOS transistor of said pull-up stage, wherein said output of said at least one inverter of said second control circuit is the inverse of said voltage level of said data output node 20. The buffer as set forth in claim 19, wherein said third control circuit of said preset circuit comprises a plurality n of series-connected inverters, wherein n is an even integer equal to or greater than two.

* * * * *